United States Patent [19]

Puskas

[11] 3,828,257

[45] Aug. 6, 1974

[54] VHF-UHF VARACTOR TUNING SYSTEM INCORPORATING AUTOMATIC FREQUENCY CONTROL WITH EQUALIZATION

[75] Inventor: Jeffrey A. Puskas, Glendale Heights, Ill.

[73] Assignee: Zenith Radio Corporation, Chicago, Ill.

[22] Filed: Aug. 10, 1972

[21] Appl. No.: 279,610

[52] U.S. Cl. .................. 325/418, 325/423, 325/465, 334/14, 178/5.8 R, 325/461

[51] Int. Cl. .............................................. H04b 1/16

[58] Field of Search .......... 334/14, 15, 16; 324/346, 324/418, 459, 461, 464, 465, 462, 468, 420, 423, 452, 453, 457, 458; 178/5.8 R

[56] References Cited

UNITED STATES PATENTS

| | | | |
|---|---|---|---|
| 3,631,347 | 12/1971 | Chipman | 324/461 |
| 3,646,450 | 2/1972 | Ma | 325/465 |
| 3,679,990 | 7/1972 | Hiday et al. | 325/15 |
| 3,686,575 | 8/1972 | Chamberlain | 325/461 X |
| 3,693,094 | 9/1972 | Kaudmaru et al. | 325/16 |

*Primary Examiner*—Richard Murray
*Assistant Examiner*—Aristotelis M. Psitos
*Attorney, Agent, or Firm*—Nicholas A. Camasto; John J. Pederson

[57] ABSTRACT

A VHF and UHF tuning system, comprising VHF and UHF varactor tuners, has an unbalanced AFC discriminator with a voltage divider across its output. The high voltage terminal of the divider is connected to the anode of the VHF tuner heterodyne oscillator varactor and the low voltage terminal is connected to the anode of the UHF tuner heterodyne oscillator varactor. A tuning voltage is applied independently of the AFC voltage to the cathodes of all tuning system varactors. As a result, only the tuner heterodyne oscillators are controlled by the discriminator and automatic AFC equalization is provided by the voltage divider.

3 Claims, 3 Drawing Figures

VHF-UHF VARACTOR TUNING SYSTEM INCORPORATING AUTOMATIC FREQUENCY CONTROL WITH EQUALIZATION

BACKGROUND OF THE INVENTION

The present invention is directed to an improved tuning system incorporating automatic frequency control for television receivers.

The general concept of employing a tuning system incorporating automatic frequency control into a television receiver is certainly well known in the art. Unfortunately, tuning systems having varactor tuners comprising varactor tuned stages and varactor heterodyning oscillators have introduced new problems for automatically controlling the tuning frequency of such tuning systems.

A varactor is a device whose capacitance decreases with increased applied voltage, more abruptly at the lower applied voltages then at higher applied voltages. A tuning voltage applied to each varactor, tunes each tuned stage and heterodyne oscillator. Normally, all stages of a varactor tuner will require the same tuning voltage to tune a particular broadcast channel.

The prior art method of incorporating automatic frequency control into such a system has been to interpose a balanced discriminator network in series between the tuning voltage and the varactors. Such networks, as well known in the art, provide a control voltage, the magnitude of which is dependent upon the deviation of the actual frequency of the video component of the intermediate frequency signal developed by the tuner and its desired frequency. The discriminator control voltage varies the tuning voltage by the proper amount to maintain the tuning of the tuner to the particular channel desired. However, such a system has a number of drawbacks.

First, by interposing the balanced discriminator between the tuning voltage and the tuner varactors, the discriminator must work against the tuning voltage supply which is usually a low impedance source. Therefore, for the discriminator to have any control effect, it must have a relatively high current capacity, and, in the usual case, extra stages of amplification are required.

It is also common practice to isolate the low impedance tuning voltage source from the varactor stages by placing a resistor of relatively high value in series between the tuning voltage supply and the varactor stages. Unfortunately, the leakage current characteristic of a varactor is such that with the high temperatures encountered in the receivers, leakage current can establish a sufficiently high voltage drop across the series isolation resistor to adversely affect tuning.

Another problem with prior art systems is that all tuned stages are affected by the control voltage because the tuning voltage and the control voltage are applied in common to all stages. Thus, stages which are not required, or even desired, to be controlled may be mistuned.

Systems incorporating a tuner for VHF and a tuner for UHF generally use the same discriminator network. As is well known, less control voltage is necessary for UHF automatic frequency control than is required for VHF automatic frequency control. To compensate for this, an extra load at the discriminator output is usually switched into the discriminator circuit when UHF tuning is desired to cause the control voltage excursions to be smaller. This has become known as AFC equalization. This however, has required a mechanical switch or relay which would be desirable to eliminate.

One system which does much to eliminate certain of the prior art problems is described in U.S. Pat. No. 3,544,903, issued to Yoichi Sakamoto on Dec. 1, 1970. In that system the tuning voltage and the control voltage are separated so that only the heterodyning oscillator varactor has the control voltage applied to it. The other stages only experience the tuning voltage which is applied at one side of their tuning varactors while the other side is grounded. The heterodyne oscillator varactor on the other hand has the tuning voltage applied to one terminal and the control voltage applied to the other terminal. Unfortunately, in this system, there is no provision for equalizing the automatic frequency control action of the AFC discriminator and such a system is not suitable for tuning both UHF and VHF channels.

It is therefore an object of the present invention to provide a new and improved tuning system of the varactor type which incorporates automatic frequency control.

It is another object of the invention to provide a UHF-VHF tuning system of the varactor type incorporating automatic frequency control wherein only the heterodyne oscillator is controlled independently of the tuned circuits of the tuning system.

It is a more specific object of the invention to provide a new and improved tuning system for VHF and UHF tuning which incorporates automatic frequency control in an equalized manner without the need for mechanical switching.

It is still a further object of the invention to provide a VHF-UHF tuning system for a television receiver incorporating automatic frequency control where the discriminator network may be one of low current capability.

SUMMARY OF THE INVENTION

The invention provides a VHF-UHF television tuning system of the type incorporating automatic frequency control with AFC equalization for VHF and UHF tuning, and having a pair of varactor tuners, one for VHF tuning and the other for UHF tuning, each comprising at least a video modulated carrier and for deriving therefrom an intermediate frequency signal having a video component of a desired frequency. The system comprises tuning voltage means coupled to the varactor tuned stage for establishing the tuned stage in a nominally tuned condition. The system also comprises means including an unbalanced discriminator network, responsive to the intermediate frequency signal, for developing a control voltage, the magnitude of which is dependent upon the deviation of the actual frequency of the video IF component from its aforesaid desired frequency, control voltage equalizing means coupled across the unbalanced discriminator network having high and low voltage terminals, and the VHF varactor heterodyne oscillator coupled between the high voltage terminal of the control voltage equalizing means and the UHF varactor heterodyne oscillator coupled between the low voltage terminal and the tuning voltage means to effect control of the varactor tuners in an equalized manner and to maintain the frequency of the video intermediate frequency component at its aforementioned desired value by affecting only the varactor heretodyne oscillators independently of the tuned stages.

DESCRIPTION OF THE DRAWINGS

Referring now to FIG. 1, the VHF-UHF tuning system embodying the present invention there represented comprises unbalanced AFC discriminator circuit 10, control voltage equalizing means 30, VHF varactor tuner 50, UHF varactor tuner 40, and tuning voltage means comprising resistors 71 and 72 and Zener diode 73.

Figure 1:
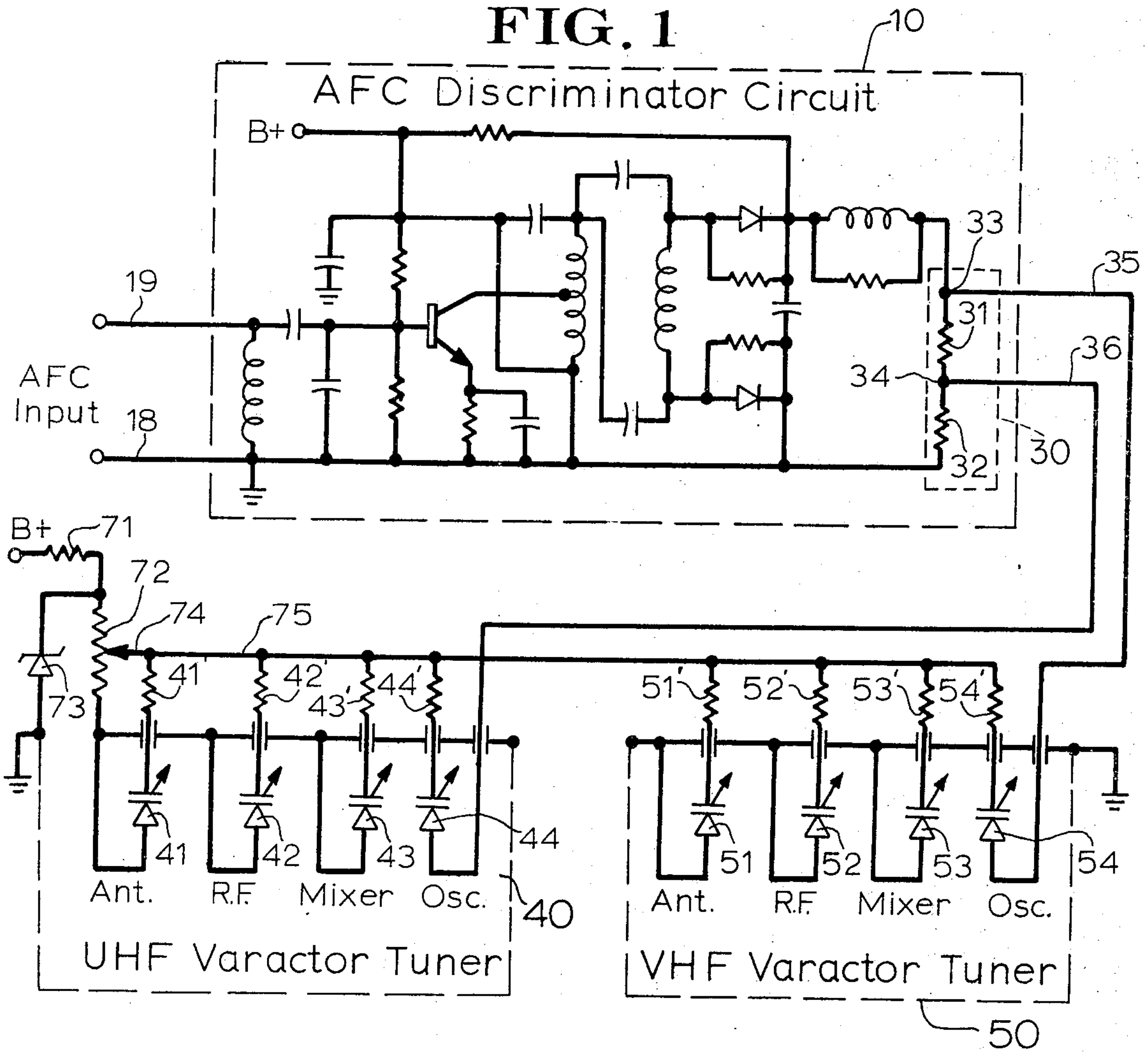
FIG. 1 is a schematic circuit diagram, partly in block form, of a VHF-UHF tuning system embodying the present invention.

AFC discriminator circuit 10 is of conventional design and will not be described in detail since it is of the type well known in the art. It has input terminals 18 and 19 coupled to an intermediate frequency amplifier (not shown) from which in accordance with general practice the actual frequency of the IF video component of the television signal to be received is obtained. As is well known in the art AFC discriminator circuit 10 produces at its output a control voltage, the magnitude of which is dependent upon the deviation of the actual frequency of the video IF component of the received signal from its desired frequency.

UHF varactor tuner 40 and VHF varactor tuner 50 each comprise antenna, RF, mixer, and heterodyne oscillator stages. UHF varactor tuner 40 comprises varactor antenna stage 41, varactor RF stage 42, varactor mixer stage 43, and varactor oscillator stage 44. The VHF varactor tuner comprises varactor antenna stage 51, varactor RF stage 52, varactor mixer stage 53, and varactor heterodyne oscillator stage 54. Each of the stages of the tunners is represented only by an appropriately numbered varactor since the circuit details of VHF and UHF varactor tuners are well known.

Each of the varactors of the tuners is coupled to a tuning voltage means comprising resistor 71, variable resistor 72, and Zener diode 73. Resistor 71 is coupled to a B+ voltage terminal and the appropriate tuning voltage is tapped off of variable resistor 72 by wiper 74 which is connected to tuning line 75. Tuning line 75 is connected to the cathode of each tuner varactor via a corresponding prime numbered resistor. Zener diode 73 assures that the tuning voltage remains constant.

As mentioned earlier, a tuning voltage source is usually a low impedance source, and such is the case represented in FIG. 1. However, the control voltage from AFC discriminator 10 is not in series with the tuning voltage, and does not work against the low impedance of the tuning source. Rather, the output of the AFC discriminator circuit 10 is coupled to the anode terminals of the varactors of the oscillator stages of both the UHF and VHF tuners. Thus, extra stages of amplification following the discriminator are unnecessary.

The control voltage from AFC discriminator circuit 10 is applied to the oscillator stages of the UHF and VHF varactor tuners independently of the tuning voltages, and independently of one another by a pair of control voltage lines 35 and 36. Across the output of AFC discriminator circuit 10 is control voltage equalizing means 30 comprising resistors 31 and 32 which form a voltage dividing circuit. Terminal 33 is the high voltage terminal and terminal 34 is the low voltage terminal. As mentioned previously, larger control voltage excursions are necessary for automatic frequency control of VHF varactor tuners as compared to the voltage excursions necessary for automatic frequency control of UHF tuners. Therefore, control voltage line 35 connects high voltage terminal 33 to the anode side of varactor diode 54 of the VHF varactor tuner heterodyne oscillator. Likewise, control voltage line 36 connects low voltage terminal 35 to the anode side of varactor diode 44 of UHF varactor tuner 40. Therefore, variations in the output of AFC circuit 10 controls the UHF or VHF tuner independently of the tuning voltage, thus circumventing the numerous difficulties of prior art systems. Also, by incorporating a voltage divider as the control voltage equalizing means 30 at the output of AFC discriminator circuit 10, the necessity for a mechanical switch or relay is avoided and AFC equalization is achieved automatically.

Figure 2A:
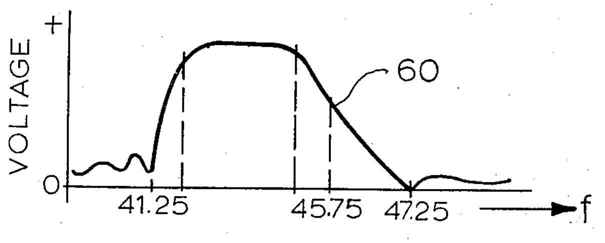
FIGS. 2A and 2B are curves employed in describing the operating characteristics of the system of FIG. 1.
Figure 2B:
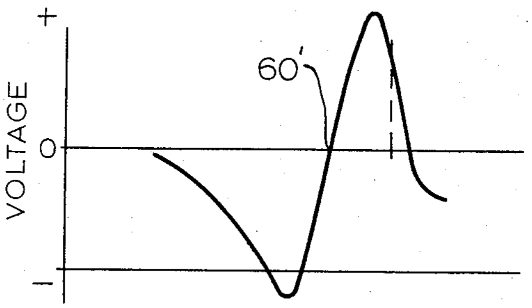

The curves of FIGS. **2*a* and 2*b* may be of considerable use in understanding the complete operation of the system. The curve of FIG. 2A is a generally idealized bandpass characteristic of an IF amplifier (not shown) which in general practice may be coupled to input terminals 18 and 19 of AFC discriminator circuit 10. A point 60 marks the desired frequency of the video IF component, about which the AFC circuit operates. The curve of FIG. 2B represents the discriminator control voltage and shows that it is zero when the video IF frequency is that indicated at point 60**. As the video IF frequency increases relative to the desired frequency, the AFC discriminator circuit produces a positive voltage and conversely if the actual frequency is lower than the desired frequency the AFC discriminator circuit produces a negative voltage.

To understand how this relates to the operation of the circuit, assume that the video IF frequency is higher than the desired frequency. The frequency of the heterodyne oscillator of the tuner which is generally greater than the RF signal frequency must decrease to reduce the video IF component frequency to correspond to the desired frequency. To accomplish this the capacity of the varactor must be increased, which, as previously mentioned, means the voltage across its terminals must be decreased. This control voltage vs. frequency relationship is clearly indicated in FIG. 2B. The converse is true when the frequency of the video IF component is lower than the desired frequency. Less capacity is needed, requiring an increase in voltage across the varactor which is accomplished by decreasing the voltage at the anode terminal thereof.

The present invention makes it possible to provide a VHF-UHF tuning system having automatic frequency control with control voltage equalization. No mechanical relays or switches are required to achieve equalization and the AFC discriminator circuit need not work against a relatively low tuning voltage source impedance. Since the control voltage is applied to only the oscillator varactor stages of the UHF and VHF tuners, the tuned stages of the tuners need not be effected. Also, the tuners need not be isolated from the low impedance source, thus alleviating the leakage current problem which produces a drift in the nominal tuning voltage applied to the tuners.

What is claimed is:

1. A VHF-UHF television tuning system of the type incorporating automatic frequency control with AFC equalization for VHF and UHF tuning, and having a pair of varactor tuners, one for VHF tuning and the other for UHF tuning, each comprising at least one varactor tuned stage and a varactor heterodyne oscillator for selecting a particular broadcast channel comprising at least a video modulated carrier and for deriving therefrom an intermediate frequency signal having a video component of a desired frequency which system comprises:

a low impedance tuning voltage source supplying voltage to each said varactor tuned stage for establishing said tuned stage in a tuned condition;

means including an unbalanced discriminator network responsive to said intermediate frequency signal for developing a control voltage the magnitude of which is dependent upon the deviation of the actual frequency of said video IF component from its aforesaid desired frequency;

control voltage equalizing means comprising a voltage divider permanently connected across said unbalanced discriminator network and having high and low voltage terminals;

and said VHF varactor heterodyne oscillator being permanently connected between said high voltage terminal of said control voltage equalizing means and said tuning voltage source and said UHF varactor heterodyne oscillator being permanently connected between said low voltage terminal of said control voltage means and said tuning voltage source to effect control of said varactor tuners in an equalized manner and to maintain the frequency of said video intermediate frequency component at its aforesaid desired value by affecting only said varactor heterodyne oscillators independently of said tuned stages.

2. A VHF-UHF television tuning system in accordance with claim 1 wherein said tuning voltage source comprises a variable resistor and a Zener diode.

3. A VHF-UHF television tuning system of the type incorporating automatic frequency control with AFC equalization for VHF and UHF tuning and having a pair of varactor tuners, one for VHF and the other for UHF tuning, each comprising a plurality of varactor tuned stages and a varactor heterodyne oscillator, said tuned stages and said varactor heterodyne oscillators each comprising a varactor diode having an anode and a cathode, for selecting a particular broadcast channel comprising at least a video modulated carrier and for deriving therefrom an intermediate frequency signal having a video component of a desired frequency, which system comprises:

a low impedance source of tuning voltage comprising a variable resistor and a Zener diode coupled to the cathodes of the varactor diodes in said tuned stages for supplying voltage thereto and establishing said tuned stages in a tuned condition;

means including an unbalanced discriminator network responsive to said intermediate frequency signal for developing a control voltage the magnitude of which is dependent upon the deviation of the actual frequency of said video component from its aforesaid desired frequency;

a voltage divider including a pair of resistors permanently connected across said unbalanced discriminator network and having a high and a low voltage terminal, said low voltage terminal being the junction of said resistors;

and the anode of said VHF oscillator varactor diode being coupled to said high voltage terminal and the cathode of said VHF oscillator diode being coupled to said tuning voltage source, the anode of said UHF oscillator varactor diode being coupled to said low voltage terminal and the cathode of said UHF oscillator varactor diode being coupled to said tuning voltage source to effect control of said varactor tuners in an equalized manner and to maintain the frequency of said video component at its aforesaid desired frequency by affecting only said varactor heterodyne oscillators independently of said tuned stages.

* * * * *